United States Patent
Wurl

Patent Number: 6,154,030
Date of Patent: Nov. 28, 2000

[54] DIGITAL EDDY CURRENT COMPENSATION

[75] Inventor: Jon G. Wurl, East Palo Alto, Calif.

[73] Assignee: Varian, Inc., Palo Alto, Calif.

[21] Appl. No.: 09/050,773

[22] Filed: Mar. 30, 1998

[51] Int. Cl.[7] .............................. G01R 33/20; G01V 3/00
[52] U.S. Cl. ......................... 324/322; 324/318; 324/309; 324/307
[58] Field of Search ................................. 324/307, 309, 324/312, 318, 321, 322

[56] References Cited

U.S. PATENT DOCUMENTS

| | | | |
|---|---|---|---|
| 4,292,589 | 9/1981 | Bonner | 324/221 |
| 4,698,591 | 10/1987 | Glover et al. | 324/307 |
| 4,743,851 | 5/1988 | Lim et al. | 324/309 |

FOREIGN PATENT DOCUMENTS 00533 173 A1   3/1993   European Pat. Off. .

OTHER PUBLICATIONS

Article by Jehenson et al., entitled "Analytical Method for the Compensation of Eddy–Current Effects Induced by Pulsed Magnetic Field Gradients in NMR Systems," published in *Journal of Magnetic Resonance* in 1990, in vol. 90, pp. 264–278.

Article by van Vaals et al., entitled "Optimization of Eddy–Current Compensation," published in *Journal of Magnetic Resonance* 1990, in vol. 90, pp. 52–70.

Article by Morich et al., entitled "Exact Temporal Eddy Current Compensation in Magnetic Resonance Imaging Systems," published in *IEEE Transactions on Medical Imaging* in 1988, in vol. 7, No. 3, pp. 247–254.

Article by van Vaals et al., entitled "Optimization of Eddy–Current Compensation", published in *Journal of Magnetic Resonance* 90 on Oct. 15, 1990, No. 1, pp. 50–70.

Article by Majors et al., entitled "Eddy current Compensation by Direct Field Detection and Digital Gradient Modification", published in *Journal of Magnetic Resonance* 87 on May 1990, No. 3, pp. 548–553.

*Primary Examiner*—Christine K. Oda
*Assistant Examiner*—Tiffany A. Fetzner
*Attorney, Agent, or Firm*—Edward H. Berkowitz

[57] ABSTRACT

Eddy current compensation for magnetic field transients arising from electric current transients is obtained by digital computation of the time dependence of the eddy current magnetic effect, reversing the sense thereof to obtain a corrective signal portion, converting both the corrective portion and the basic signal profile to analogue form, summing same and directing the pre-compensated electric current through an inductive element.

13 Claims, 7 Drawing Sheets

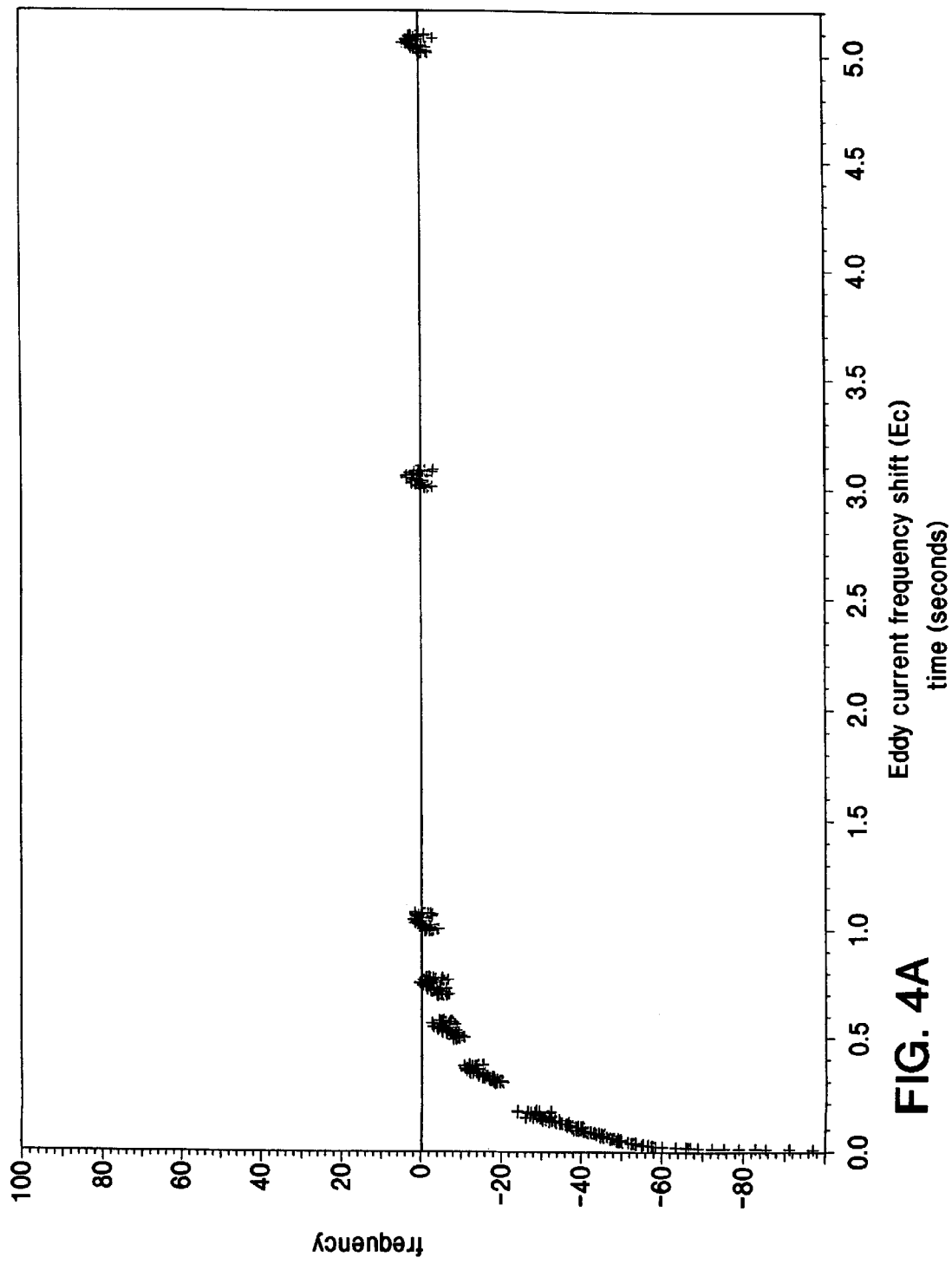

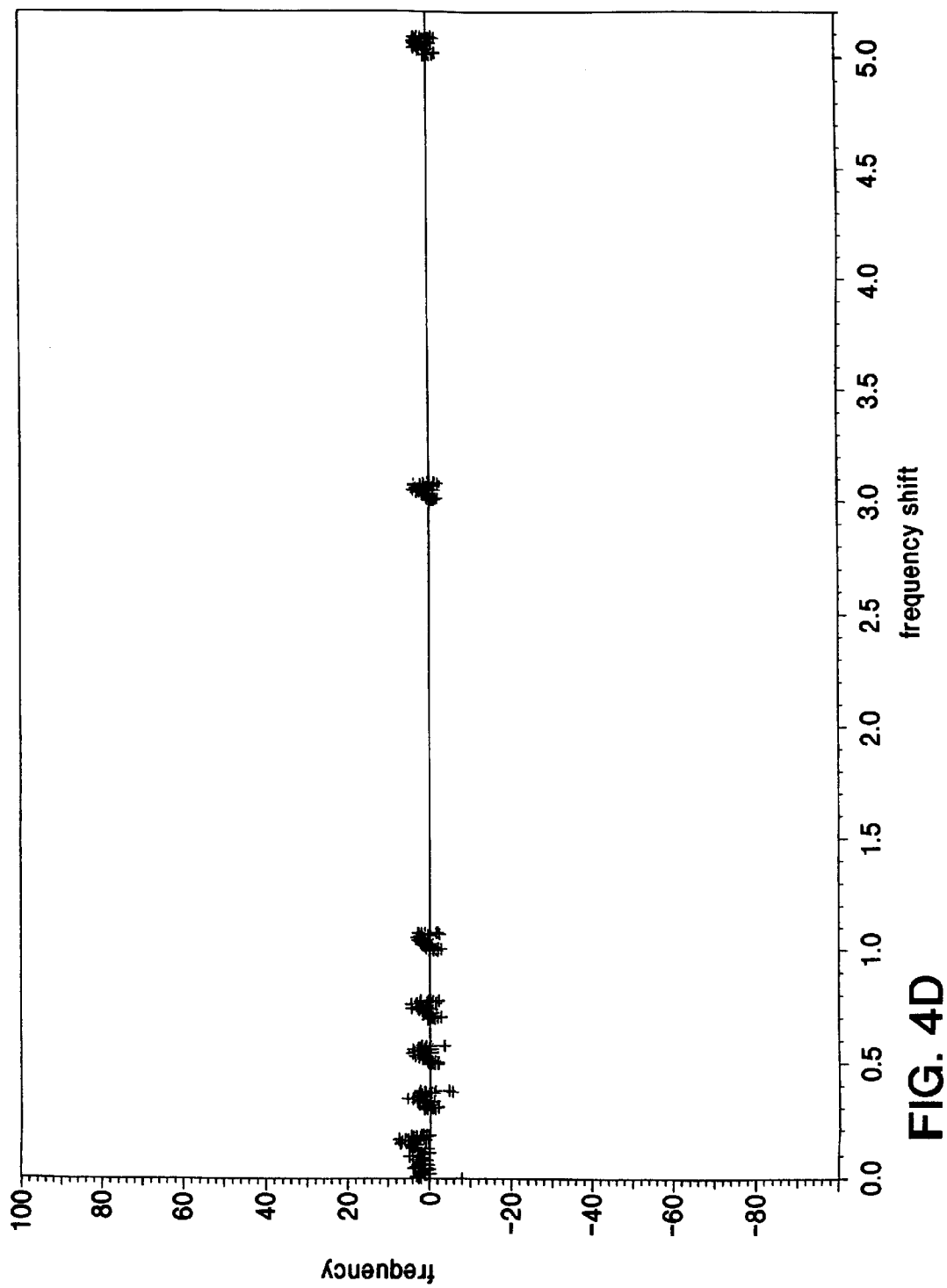

DIGITAL EDDY CURRENT COMPENSATION

FIELD OF THE INVENTION

The invention is in the field of nuclear magnetic resonance (NMR) instrumentation and pertains particularly to the reduction of disturbance in data arising from transient currents proximate the sensitive volume of an NMR instrument.

BACKGROUND OF THE INVENTION

Nuclear magnetic resonance measurement techniques require knowledge and control of the spatial and temporal properties of magnetic fields in and proximate to the sensitive volume of the instrument. Most modern NMR instruments employ transient techniques. When the magnetic field itself exhibits transient characteristics there are accompanying parasitic consequences of eddy current excitation in conducting structures of the apparatus. The eddy currents contribute an increment to the field directed in opposition to the transient, with time constants which depend upon the structure supporting the eddy current.

In the prior art it is well known to provide a delay time after a transient or to so control the time dependence of the transient as to reduce or minimize the effect of the ensuing eddy current. This is of rather limited application given other requirements for time dependence and inter-pulse delays. It is also known in the prior art to provide for magnetic shielding to reduce the coupling of the magnetic field arising from the transient current to the surrounding structures wherein the eddy currents are induced. Shielding is is no more than partially effective, at best.

It is also known to compensate the effect of eddy currents by pre-compensation, that is, a deliberate distortion of the time dependence of the applied transient so as to yield the desired time dependence for the resulting field. The prior art is fairly reviewed and summarized by Jehenson, et al, J. Mag. Res. V.90, pp. 264–278 (1990); van Vaals, et al, J. Mag. Res., vol. 90, pp 52–70 (1990); Morich, et al, IEEE Trans. Mag. Imag., vol. 7, pp. 247–254 (1988).

The desired pulse shape for a field B in the direction p may be designated $B_p(t)$ and would ideally be supplied by a voltage waveform $V(t)$ applied to coils of the appropriate orientation. We shall refer to V(t) as the "demand" pulse. In the real world, surrounding conducting structures such as nested cryostat shields, reservoir and containment vessel, probe shields and the like will have eddy currents induced thereon. These eddy currents generate magnetic field elements which are generally opposed to the field ideally associated with the demand pulse, as well as elements having diverse orientations. The time dependence of the realized pulse $B_p(t)$ is distorted relative to the time dependence of the demand pulse due to the superposition of the time constants for decay of the eddy currents on the various conducting structures. Moreover, as a consequence of eddy currents circulating on non-planar conductors, there will be eddy current induced transient field components directed along axes other than $\rho$.

More than one magnetic field component can be combined as a superposition to create spatial variations (gradients) in the resulting field. Excitation of a field element along $\rho$ may produce a desired gradient along p or a gradient along some other axis. There exists many combinations of desired gradient direction and field direction, and for each combination, there is potential for undesired eddy current distortion.

SUMMARY OF THE INVENTION

It is an object of the invention to produce a controlled transient magnetic field with reduced magnetic disturbances attributable to eddy current phenomena.

The object is achieved by pre-compensation of the current pulse to magnetic field coils where the pre-compensation is computed from the details of the current pulse and the particular design parameters of proximate conducting structures.

BRIEF DESCRIPTION OF THE DRAWINGS

FIG. 4a shows an uncompensated response of a typical apparatus.

FIG. 4d shows the magnetic field response of the apparatus of FIG. 3a with pre-empasis correction of both long and short time constant eddy currents.

FIG. 5 is a schematic illustration of an alternative embodiment of the invention.

DETAILED DESCRIPTION OF THE INVENTION

Figure 1:
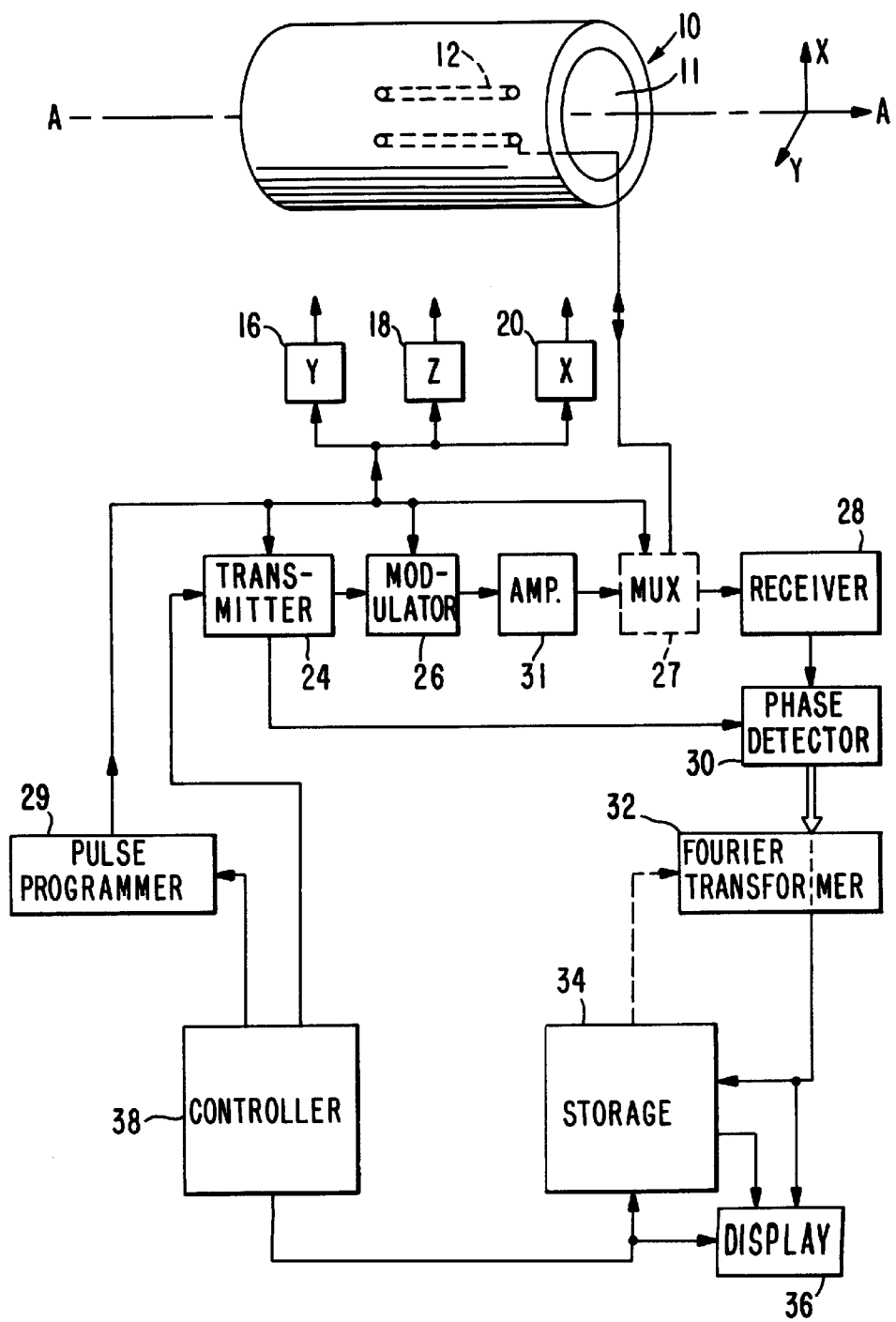
FIG. 1 schematically illustrates a generalized NMR apparatus forming the context for the invention.

A specific context for the invention is shown in FIG. 1 which illustrates schematically, an NMR apparatus wherein the desired magnetic field at points of interest is disturbed by eddy currents on surrounding structure induced by current transients.

A magnet 10 having bore 11 provides a main magnetic field. In order to control the magnetic field with precision in time and direction, there are provided magnetic field gradient coils (not shown) disposed very close to the bore 11. These are driven by gradient power supplies 16, 18 and 20, respectively. Additionally, other shimming coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by rf power, such that the rf magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

As shown in FIG. 1, rf power is provided from transmitter 24, which may be modulated in amplitude or frequency or phase or combination thereof, either upon generation or by modulator 26, is amplified by amplifier 31 and thence directed via multiplexer 27 to the rf transmitter coil 12 located within bore 11. Transmitter and receiver coils are usually not concurrently used as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide rf pulses of desired amplitude, duration and phase relative to the rf carrier at preselected time intervals. The pulse programmer may have hardware and/or software attributes. The pulse programmer also controls the gradient power supplies 16, 18 and 20, for respective Y, Z and X axes if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

The magnet 10 is ordinarily a superconducting magnet housed within a cryostat which includes a number of nested structures having generally cylindrical symmetry about the axis of said bore 11. The pulsed excitation of gradient coils by respective gradient supplies 16,18 and/or 20 induces eddy currents on these structures including the outer housing. The transient circulating eddy currents in turn furnish transient magnetic field components which produce unwanted perturbations to the desired magnetic field distribution.

It is often the case in modern usage that the signal of selected shape is prescribed digitally and formed by passing the digital representation through a digital-to-analog converter (DAC). Having the digital representation available, straightforward digital operations may be employed to obtain the distortion that such signal would be expected to generate. For the case of an eddy current contribution following from an ideal step function current pulse, the magnetic field resulting from the current pulse is smeared into an exponential decaying pulse of time constant $\tau$.

Figure 2:
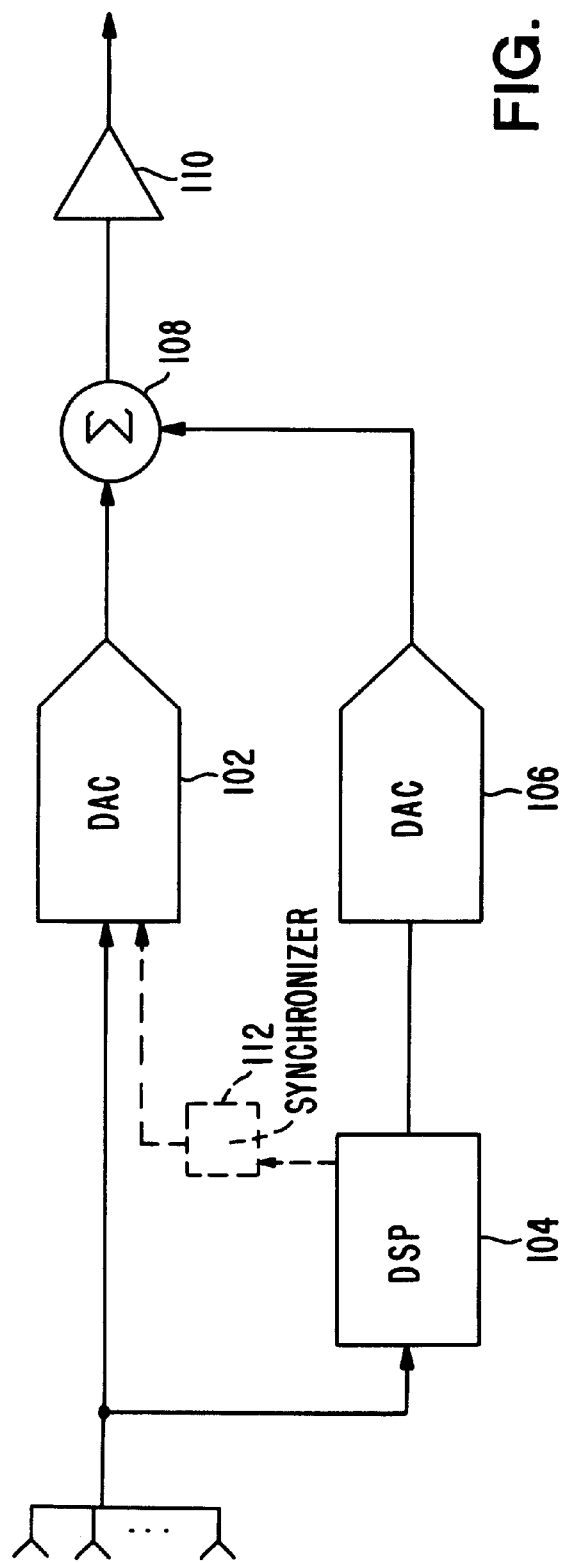
FIG. 2 is a schematic illustration of the preferred embodiment of the invention.

A preferred embodiment of the invention is shown in FIG. 2. The discussion is in terms of a step function current pulse pre-compensated to yield a magnetic field step function pulse of desired shape taking account of distortion arising from eddy currents induced in surrounding structure. The generality of the invention in respect of other diverse applications is not to be regarded as limited to this context. A desired transient profile is presented in digital form to a digital to analog converter 102 and simultaneously to a digital signal processor (DSP) or equivalent computational apparatus 104 of known digital structure to compute the distortion which is expected to arise for the resulting phenomena. The output of DSP 104 is presented to another DAC 106. The output of DAC 106 is combined with the output of DAC 102 and the result is directed through amplifier 110 for excitation of the desired pre-compensated pulse. For the case where a magnetic field is excited from a current pulse, the eddy current induced on conductor(s) proximate the current pulse carrying conductor (for example, a coil) will have the functional properties of an exponential opposing the step function, characterized by an amplitude and decay time. In this embodiment a synchronizer 112 is optional to assure the analogue realizations of the demand pulse and the correction transient add properly. This may be accomplished by a gating arrangement by which the digital output register of the eddy current calculating module 104 is strobed concurrently with an enable pulse to the DAC 102. Synchronicity of the resulting analogue signals may be further assured by known techniques such as operating upon signal magnitudes of desired relative scale to retain analogue synchronism with appropriate attenuation to provide the correct relative scale.

Possibility of loss of synchrony between the demand profile and the computed distortion can arise from the delay inherent in the compensating calculation while conversion of the digital representation of the demand signal initiates. However, the relative operational rate of the signal processor 104 and the DAC 102 is of such disparity that the calculational delay is negligible. For example, the signal processor 104 (by way of example, a Texas Instruments TMS320C32) operates in a repeating loop at high repetition rate of about 500 KHz with null input and a precision of 16 bits. The calculational delay and misphasing error are not noticeable until the precision is reduced to 4 bits and the repetition rate is reduced to about 1 KHz. In the present (eddy current correction) usage, the distortion correction is a monotonic curve representing a sum of exponentials. Consequently the translation of such curve along either time or amplitude axes is easily tolerated except when the processor 104 is delayed excessively relative to DAC 102 and the digital precision is allowed degrade to produce excessive amplitude error.

The multiple inputs shown in FIG. 2 allow for the presentation of demand transients of different channels, any of which may require compensatory activity in the given channel.

Compensation for eddy current effects is particular to the structure proximate the field point. Eddy current pre-compensation contemplates the addition of a "counter-distortion" function to the desired time profile of the field transient. The physical distortion function accompanying a simple step function signal consists of a sum of decreasing exponential functions exhibiting a characteristic set of amplitudes and corresponding time constants. These exponentials correspond to conducting structural members, not all of which may be visible. In order to establish a set of exponential functions from which to determine quantitative pre-compensating parameters, a step function demand pulse is applied and the resulting response is measured. The difference in the normalized time dependence is then fit to a sum of exponentials to extract the amplitude and corresponding time constant for each such exponential. A corresponding set of increasing exponential functions, added to the desired signal cancels with the physical effect to yield the pre-compensated signal profile.

Figure 3:
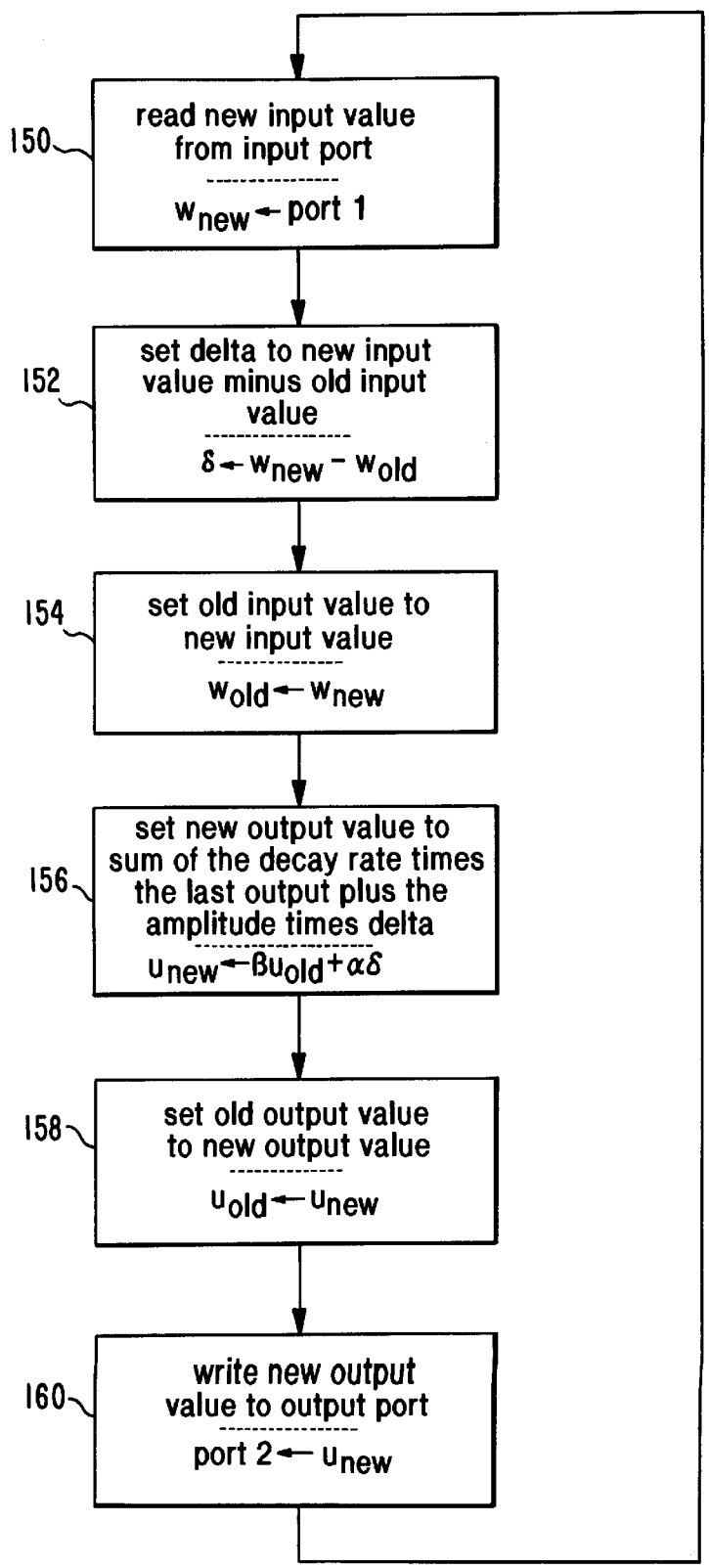
FIG. 3 represents the operation of the digital signal processor 104.

For the case of eddy current pre-compensation the corrective waveform is the result of a recursive calculation carried out by the computational module 104 as illustrated schematically in FIG. 3 (where a single time constant disturbance is treated). The calculation is of the form $$y(n) = \beta y(n-1) + \alpha \delta(n)$$

where $\alpha$ and $\beta$ are empirically determined parameters derived from the strength of the coupling of the eddy current field contribution and its time dependence, respectively, to the field point. The quantity δ(n) is simply the difference in the ordinates of consecutively sampled points for a constant sampling rate as obtained at block 152.

$$\delta(n) = y(n) - y(n-1) \quad \text{(Equ. 1)}$$

Thus, a desired field time dependence (or "demand") is specified from a list $$\vdots$$
$$w(i-1)$$
$$w(i)$$
$$w(i+1)$$
$$\vdots$$

read in turn by computational module 104 (block 150) from which there is computed a corrected signal $$\vdots$$
$$u(i-1)$$
$$u(i)$$
$$u(i+1)$$
$$\vdots$$

The processing of the demand represented by the list w(i) is carried out in a loop at a high rate, for example, 250 KHz. Steps 150, 154, 158 and 160 represent simple input rearrangement of variables and output as shown. The quantities δ (obtained at block 152) and the corrected discrete signal amplitude is computed at block 156 for the corresponding abscissa which is determined by the processing rate of the combination of the computational module and the DAC. The latter is independently controlled from a clocked pulse. The clock rate determines the time scale for the pulse as realized in the conductors which effectuate the pre-corrected transient magnetic field pulse. An asynchronous relationship between the loop rate of the computational module 104 and the DAC clocking rate is satisfactory when the loop rate is very fast (typical factor of 8–10, for example) in relation to the DAC clock rate. (The pulse width is ultimately the criterion for any relationship of these rates. So long as the loop rate is fast in comparison to any other frequency limiting components, the loop rate will be satisfactory.) As these rates become comparable, a synchronous relationship as suggested in the dotted line arrangement 112 of FIG. 2, preserves the integrity of the correction.

For the case of a step function one has $$w(n) = 0 \text{ for } n < 0$$
$$w(n) = 1 \text{ for } n \geq 0$$

Thus by equation 1

$$u(0) = \alpha$$

and for $$u(1) = \beta \alpha$$
$$u(2) = \beta^2 \alpha$$
$$\vdots$$
$$u(n) = \beta^n \alpha \quad n \geq 0$$

For the present case $\beta = \exp(-T/\rho)$ where ρ is the empirically determined eddy current induced field decay constant and T is a selected time interval establishing the selected DAC update rate. The quantities β and α are constants.

Performance of the invention is illustrated below for a simple case of the excitation of the magnetic field gradient $\partial H_z/\partial Z$. In order to investigate the operation of the present invention, a typical superconducting NMR magnet was employed with an NMR sample at the center of the sensitive volume and a second sample offset in the direction of the gradient to be corrected. As a rule, a gradient pulse is applied to the sensitive volume of the magnet symmetrically about the center: that is, the field component arising from the contribution of the applied gradient is a spatial function and this function passes through zero at the center. The sample disposed at the center substantially measures the field arising from the spatially uniform polarizing field at the region of minimal gradient. The offset sample serves to measure the field at the offset position and thus the difference in resonance frequency of the two samples produces a measure of the actual magnetic field gradient. The eddy currents modulate the magnetic field as a function of time over the duration of the transient and this is observed by acquiring free induction decay waveforms arising from the displaced samples as a function of delay between excitation and acquisition.

For the particular magnet in which these experiments were carried out, it could be determined that there was a time dependence experienced in the magnetic field for the Z direction (polarizing axis) which can be expressed as $$Z(t) = 0.044 \exp(-t/270) - 0.114 \exp(-t/75) + 0.013 \exp(-t/4)$$

where the coefficients represent relationship to the amplitude of the applied current pulse (the demand pulse) and the times are in milliseconds. The three time constants are interpreted to represent the eddy currents sustained on the outer bore of the cryostat container surrounding the NMR probe and on major internal structures within the cryostat. Other magnetic field axes and gradient directions, when applied, effect the field along Z and gradients, and vice versa. The amplitudes measure the intensity of the resulting transient magnetic field due to the eddy current circulating on the respective structure. The time constants measure the exponential decay characteristics. These parameters are obtained experimentally by observation of the waveform resulting from a standard step function excitation, as above explained. The parameter set, thus obtained, is then utilized by the computational module 104 during operation.

Figure 4B:
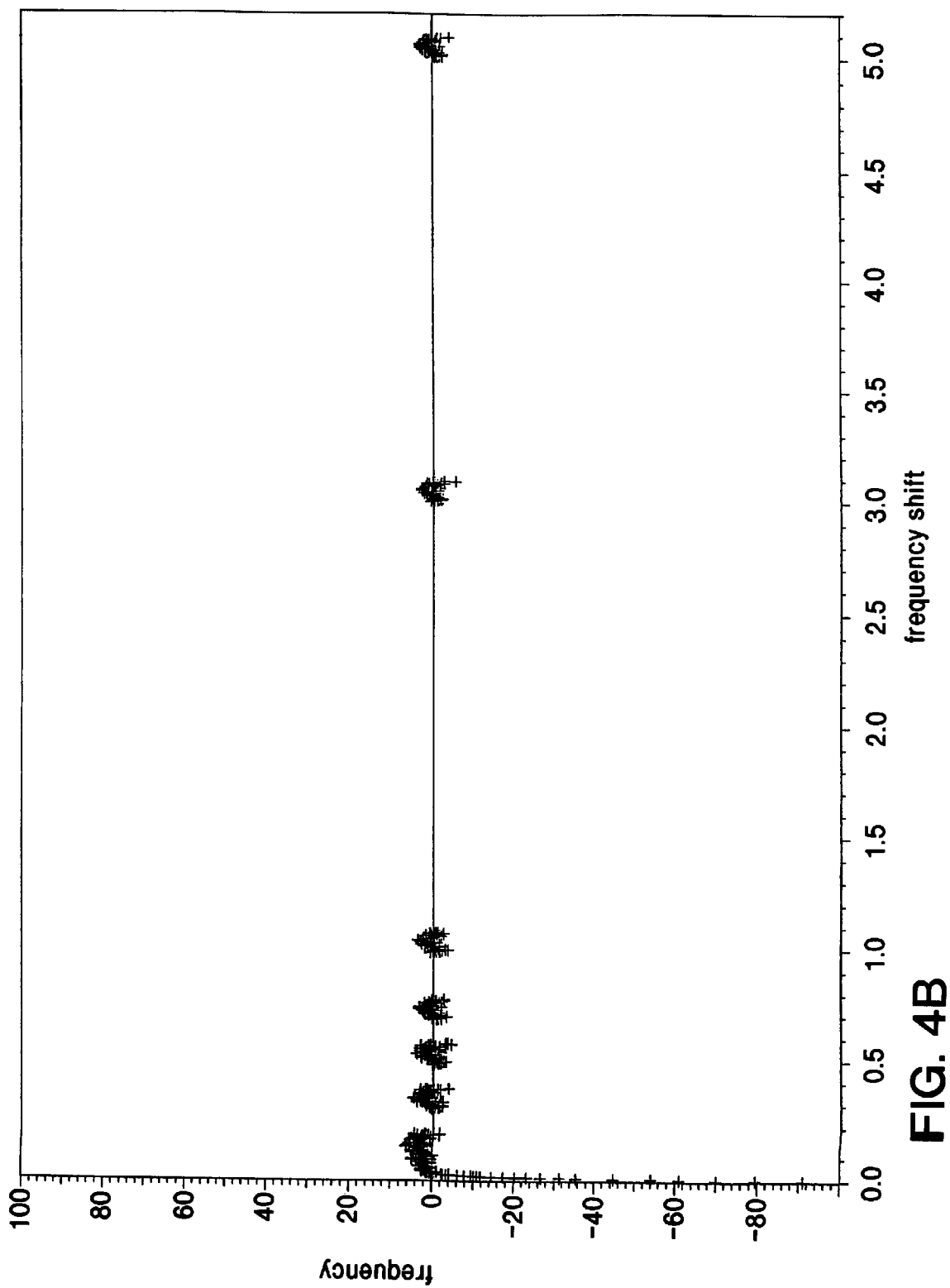
FIG. 4b shows the magnetic field response of the apparatus of FIG. 3a with pre-emphasis correction of a long time constant eddy current.
Figure 4C:
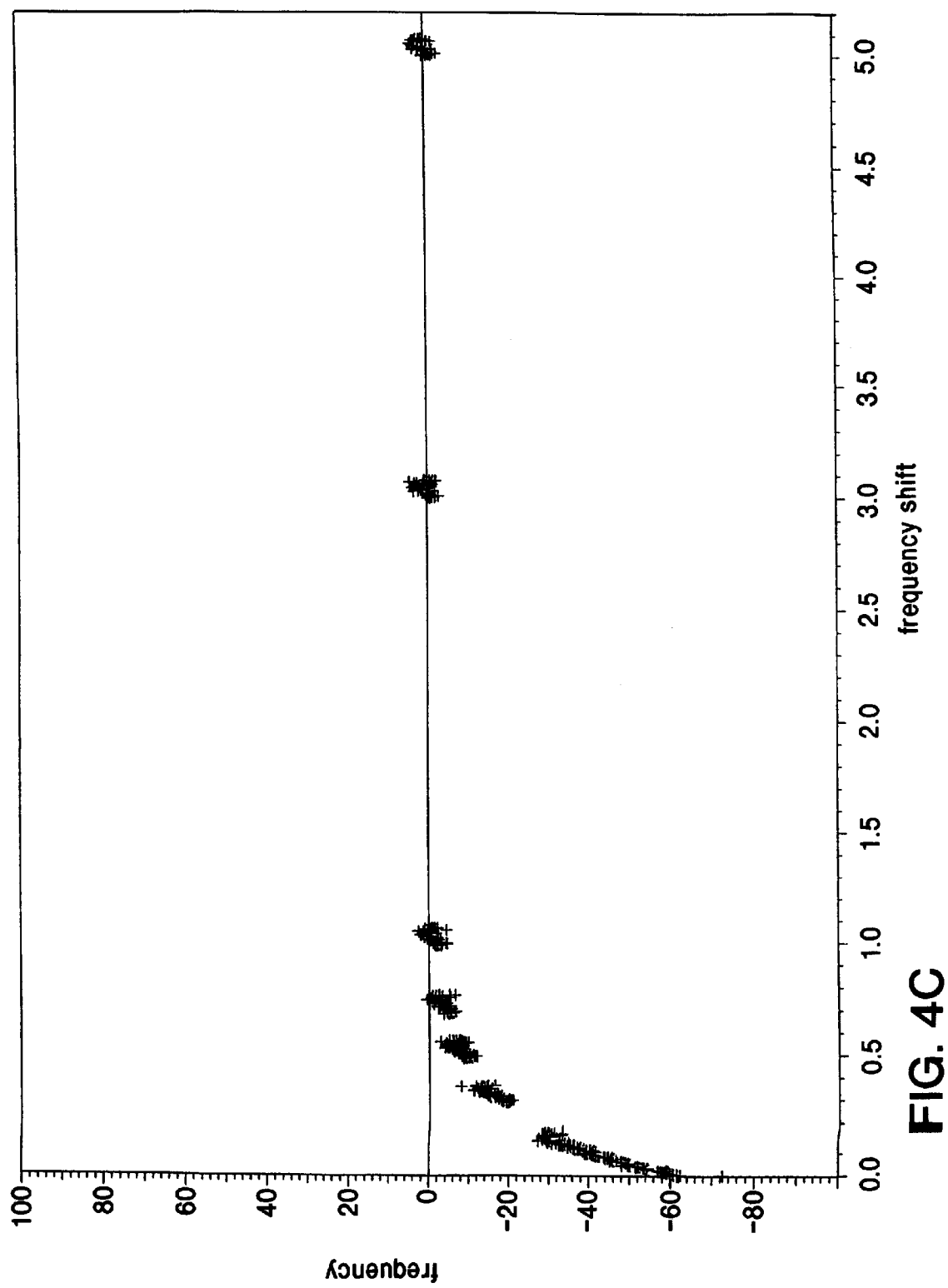
FIG. 4c shows the magnetic field response of the apparatus of FIG. 3a with pre-empasis correction of short time constant eddy currents.

FIG. 4a shows the frequency shift offset recorded without any compensation. At FIG. 4b pre-compensation of a long (270 ms.) time constant is applied. The effect of the short time constants (4 and 75 ms.) is evident close to the time origin. FIG. 4c is the result of application of pre-compensation of the short time constants absent compensation of the long time constant. FIG. 4d pre-compensates both the long and the short time constants with a resulting sharp step function in magnetic field along the selected direction.

In common arrangements, the magnetic field pulses are gradient pulses, i.e. having a desired spatial dependence. In the above example, the field is oriented in the Z direction and the magnitude varies as a function of Z, e.g., it has a Z gradient. From basic electromagnetic theory, together with the details of the specific geometry of conductors on which eddy currents are induced and propagate, it is apparent that the applied magnetic field pulse will be accompanied by undesirable components of diverse direction and spatial variation. In the practice of NMR, most often, the magnetic field is oriented along a single (principal) axis and gradient fields may be applied along any selected one of three orthogonal axes. To obtain a gradient along some oblique direction, multiple concurrent gradients may be simultaneously applied. By the principle of superposition, it is only necessary to consider each axis separately, for purposes of general analysis as well as for the physical realization of the invention.

Where the undesirable effect of an eddy current is a gradient along the same direction as the applied gradient, the effect is frequently the greatest and the example discussed above is of this class. Undesirable gradients orthogonal to an applied gradient also arise from eddy currents and are similarly pre-compensated. The computed distortion is simply inverted and the pre-compensation merely nulls the undesirable eddy current driven gradient. Yet a third type of parasitic effect may arise from a gradient applied in any direction; this is a shift in the magnitude of the magnetic field. The correction to be applied in this latter case is a spatially constant magnetic increment.

The digitally represented demand signal and the digitally computed correction could be combined by digital methods within DSP 204 and converted at DAC 206 as illustrated in FIG. 5, but such an arrangement suffers several burdens. Most significant is the limit to dynamic range occasioned by the finite width of the digital instrumentation. The summation of the two analog signals is commonly realized with a relatively large dynamic range and is preferred for the practice of the invention. By contrast with the embodiment of FIG. 5, the separate DAC arrangement of FIG. 2 allows independent dynamic range for both the demand pulse and the correction.

In another embodiment, the digital demand is not provided separately as a list of digital words, but is internally generated within the computational module 104. In this embodiment, the computational module 104 receives a parameter establishing the type of pulse and such parameters as required for that type of pulse, e.g., pulse width, amplitude (as for example specifying a rectangular pulse) and the desired demand is created together with the eddy current corrections.

The pre-compensation arrangement of the present invention has more general application then the eddy current compensation here discussed. In any open loop system where a digital representation of a desired excitation has an a priori calculable distortion effect upon a physical system, e.g., a transducer, the invention may be applied to prepare the required pre-compensation and synthesize the appropriate waveform. It is only necessary that the undesirable responses of the physical system are known or can be measured via canonical experiments and where the signal to be applied may be operated upon to obtain the compensatory waveform. Digital audio systems are an example of another such context of application. Such system includes audio output including a speaker having undesirable response characteristics. Instead of driving the speaker with the original digital data, a calculated pre-compensating component is computed and combined with the original digital data to produce a signal to drive the speaker, thereby improving and /or extending the range of satisfactory operation. For such application the computational module produces a sinusoidal corrective function. Recursion techniques to achieve such dependence are known to those of skill in the art.

Whereas the invention is here illustrated and described with reference to embodiments presently contemplated as the best mode of carrying out such invention in actual practice, it is to be understood that various changes may be made in adapting the invention to different embodiments without departing from the broader inventive concepts disclosed herein and comprehended by the following claims.

What is claimed is:

1. Magnetic Resonance Apparatus for re-shaping a signal of selected shape to pre-compensate said signal for expected eddy current distortion thereof of a first sense, comprising (a) selected signal descriptive module for providing a digital representation of said signal of selected shape, (b) a computational module cyclically operative at a first cyclic rate upon said digital representation to compute the opposite sense of said expected eddy current distortion of said selected signal, whereby a corrective signal portion is obtained, (c) a first converter module to transform said corrective signal portion to the analogue representation of the resulting distorted signal, and a second converter module to transform the digital representation of said signal of selected shape to an analogue representation, said second converter module operating substantially concurrently with the operation of said computational module, said first and second converter modules each operative at a selected clocking rate, said first rate being very fast in relation to said selected clocking rate, (d) signal combiner for combining said analogue distortion signal and said signal of selected shape whereby said magnetic resonance apparatus compensates for said expected eddy current distortion.

2. The apparatus of claim 1 further comprising a current amplifier operative upon the output of said signal combiner for supplying a current transient exhibiting the desired distorted profile.

3. The apparatus of claim 2 wherein said expected distortion represents the magnetic effect of eddy currents incident to a current pulse.

4. The apparatus of claim 3 wherein said digital representation of said signal of desired shape comprises a list of digital words specifying the amplitude and independent coordinate of sample points comprising said selected shape.

5. The apparatus of claim 3 wherein said digital representation of said signal of desired shape comprises an identifier for said selected shape and a list of parameters prescribing said selected shape.

6. The apparatus of claim 5 wherein said computational module operates upon said identifier and said list of parameters to provide said signal of selected shape.

7. The apparatus of claim 1 comprising a synchronizer to maintain the synchrony of said analogue representations of said corrective portion and said signal of selected shape.

8. The apparatus of claim 1 comprising a synchronizer to maintain the synchrony of presentation of said digital representation of said selected signal to said second converter module with an operational function of said computational module.

9. The apparatus of claim 8 wherein said operational function comprises the completion of the computation of said corrective portion.

10. Magnetic Resonance Apparatus for re-shaping a signal of selected shape to pre-compensate said signal for expected eddy current distortion thereof of a first sense, comprising (a) selected signal descriptive module for providing a digital representation of said signal of selected shape, (b) a computational module operative upon said digital representation to compute the opposite sense of said expected eddy current distortion of said selected signal, whereby a corrective signal portion is obtained, (c) a first converter module to transform said corrective signal portion to the analogue representation of the resulting distorted signal, and a second converter module to transform the digital representation of said signal of selected shape to an analogue representation, said second converter module operating substantially concurrent with the operation of said computational module, (d) signal combiner for combining said analogue distortion signal and said signal of selected shape whereby said magnetic resonance apparatus compensates for said expected eddy current distortion, and wherein said computational module operates cyclically at a first cyclic rate to produce a sequence of digital samples representative of a corrective portion of said desired signal and said first converter module operates upon said sequence of digital samples at a rate less than, or about one tenth said first cyclic rate.

11. The method of pre-compensating the magnetic effect of eddy currents in conductors proximate a load consequent to an electric current transient having a desired time profile resulting in a distorted time profile when propagated through said load for use with a magnetic resonance apparatus, whereby a resulting magnetic transient will exhibit said desired time profile, comprising the steps of (a) determining a discrete set of digital samples to describe said desired time profile, (b) computing the magnetic effect of said eddy currents to produce a corresponding discrete set of corrective signal portions for remediating said magnetic effect, (c) transforming said set of digital samples to analogue form, and transforming said corrective signal portions to analogue form, said step of computing carried out at a rate which is very fast in relation to the rate of said step of transforming, (d) combining said analogue transformed corrective signal portions with said analogue transformed digital samples to produce a pre-compensated electrical current transient; and (e) directing said electrical current transient through an inductive element to produce said magnetic transient.

12. The method of claim 11 wherein said step of computing is executed substantially prior to said step of transforming said set of digital samples.

13. The method of claim 11 wherein said step of computing is executed substantially concurrent with said set of digital samples.

* * * * *